US009679787B2

(12) United States Patent
Furuya

(10) Patent No.: US 9,679,787 B2
(45) Date of Patent: Jun. 13, 2017

(54) SPIN TREATMENT APPARATUS

(71) Applicant: SHIBAURA MECHATRONICS CORPORATION, Yokohama-shi (JP)

(72) Inventor: Masaaki Furuya, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 14/472,923

(22) Filed: Aug. 29, 2014

(65) Prior Publication Data
US 2015/0059642 A1 Mar. 5, 2015

(30) Foreign Application Priority Data

Aug. 30, 2013 (JP) .................................. 2013-179910

(51) Int. Cl.
B05C 13/00 (2006.01)
H01L 21/00 (2006.01)
H01L 21/67 (2006.01)
G03F 7/30 (2006.01)
H01L 21/687 (2006.01)
G03F 7/16 (2006.01)

(52) U.S. Cl.
CPC ...... *H01L 21/67028* (2013.01); *G03F 7/3021* (2013.01); *H01L 21/6715* (2013.01); *H01L 21/67051* (2013.01); *G03F 7/162* (2013.01); *H01L 21/68785* (2013.01)

(58) Field of Classification Search
None
See application file for complete search history.

(56) References Cited

U.S. PATENT DOCUMENTS 4,393,807 A * 7/1983 Fujimura ................ G03F 7/162
118/320
5,927,303 A * 7/1999 Miya .................... H01L 21/6715
134/148

(Continued)

FOREIGN PATENT DOCUMENTS

JP 2001-212493 8/2001
JP 2009-76878 A 4/2009
KR 10-2009-0012037 A 2/2009

OTHER PUBLICATIONS

Office Action issued Sep. 7, 2015 in Korean Patent Application No. 10-2014-0113000 (with English language translation).

*Primary Examiner* — Binu Thomas
(74) *Attorney, Agent, or Firm* — Oblon, McClelland, Maier & Neustadt, L.L.P.

(57) ABSTRACT

A spin treatment apparatus includes an annular liquid receiver, an annular cup body and an annular partitioning member. The annular liquid receiver surrounds a rotating substrate at a distance from an outer periphery of the substrate and is configured to receive liquid flying from the rotating substrate and accommodate the liquid. The annular cup body surrounds the liquid receiver at a distance from an outer periphery of the liquid receiver and forms an annular outer exhaust flow channel for generating an airflow along an upper surface to an outer peripheral surface of the liquid receiver. The annular partitioning member is provided inside the annular liquid receiver and forms an annular inner exhaust flow channel for generating an airflow along an inner peripheral surface to a lower surface of the liquid receiver.

10 Claims, 5 Drawing Sheets

(56) References Cited

U.S. PATENT DOCUMENTS

| | | | | |
|---|---|---|---|---|
| 5,965,200 A | * | 10/1999 | Tateyama | B05C 11/1039 |
| | | | | 118/320 |
| 2003/0010671 A1 | * | 1/2003 | Orii | H01L 21/67051 |
| | | | | 206/710 |
| 2005/0181142 A1 | * | 8/2005 | Hirano | B05B 5/0407 |
| | | | | 427/421.1 |
| 2006/0130747 A1 | * | 6/2006 | Ishikawa | H01L 21/6715 |
| | | | | 118/52 |
| 2009/0025637 A1 | * | 1/2009 | Terada | H01L 21/6715 |
| | | | | 118/500 |

\* cited by examiner

SPIN TREATMENT APPARATUS

CROSS-REFERENCE TO THE RELATED APPLICATION

This application is based on and claims the benefit of priority from Japanese Patent Application No. 2013-179910, filed on Aug. 30, 2013; the entire contents of which are incorporated herein by reference.

FIELD

An embodiment discussed herein relates to a spin treatment apparatus.

BACKGROUND

A manufacturing process for a semiconductor device or a liquid crystal display device typically includes a film-forming process or a photolithography process to form a circuit pattern on a substrate such as a wafer or a glass plate. These processes use a spin treatment apparatus to subject the substrate to treatments such as a chemical treatment, a washing treatment, and a drying treatment.

The spin treatment apparatus performs a wet treatment by clamping the outer peripheral surface of a substrate, rotating the substrate with the axis of rotation being an axis perpendicular to the substrate at the center thereof, and supplying a treatment liquid (e.g., a chemical liquid or pure water) to the rotating substrate. This spin treatment apparatus includes an annular liquid receiver configured to receive the treatment liquid flying from the rotating substrate. This liquid receiver is provided at a predetermined distance from the outer peripheral surface (end surface) of the rotating substrate.

The liquid receiver needs to receive liquid flying from the end of the substrate and also needs to prevent the liquid that hits the wall surface of the liquid receiver from splashing back toward the substrate. To prevent droplets splashing back from the wall surface of the liquid receiver from returning to the substrate surface (liquid splash-back), the wall surface of the liquid receiver is placed away from the end of the substrate.

However, as described above, in order to place the wall surface (inner peripheral surface) of the annular liquid receiver away from the end of the substrate for prevention of the liquid splash-back to the substrate, the outer shape of the liquid receiver needs to be larger accordingly. This increases the size and the weight of the spin treatment apparatus. For this reason, a spin treatment apparatus which is small and light, yet capable of suppressing the liquid splash-back to the substrate is demanded.

DETAILED DESCRIPTION

According to one embodiment, a spin treatment apparatus that performs treatment on a substrate while rotating the substrate, the apparatus comprises: an annular liquid receiver surrounding the rotating substrate at a distance from an outer periphery of the substrate and configured to receive liquid flying from the rotating substrate and accommodate the liquid; an annular cup body surrounding the liquid receiver at a distance from an outer periphery of the liquid receiver and forming an annular outer exhaust flow channel for generating an airflow along an upper surface to an outer peripheral surface of the liquid receiver; and an annular partitioning member provided inside the annular liquid receiver and forming an annular inner exhaust flow channel for generating an airflow along an inner peripheral surface of the liquid receiver.

According to another embodiment, a spin treatment apparatus that performs treatment on a substrate while rotating the substrate, the apparatus comprises: an annular liquid receiver surrounding the rotating substrate at a distance from an outer periphery of the substrate and configured to receive liquid flying from the rotating substrate and accommodate the liquid, wherein the liquid receiver includes a plurality of slanted plate members each provided on an inner peripheral surface of the liquid receiver in such a manner as to slant relative to a substrate surface of the rotating substrate and configured to receive liquid flying from the rotating substrate.

An embodiment is described with reference to the drawings.

Figure 1:
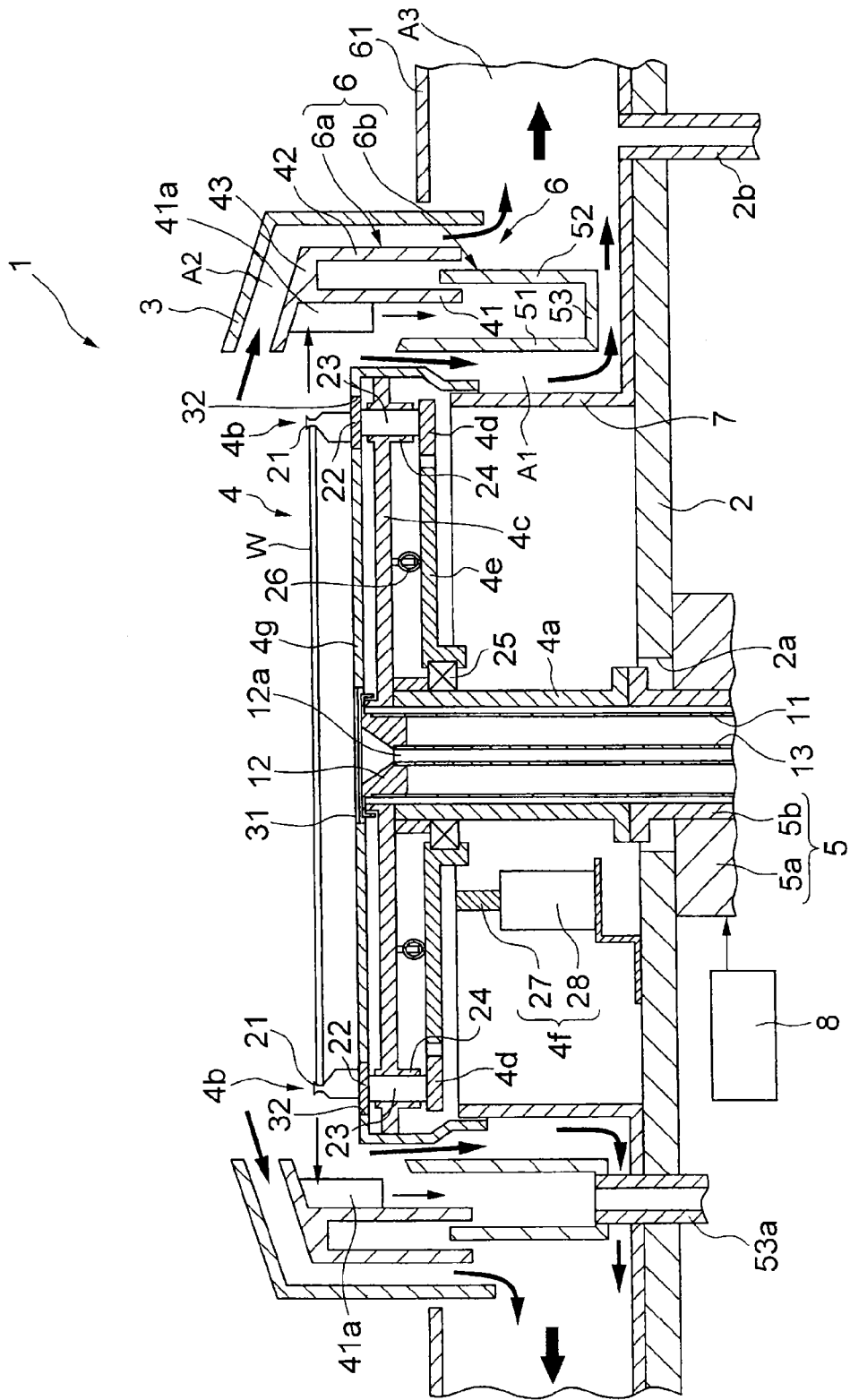
FIG. 1 is a sectional view showing the schematic configuration of a spin treatment apparatus according to an embodiment.
Figure 2:
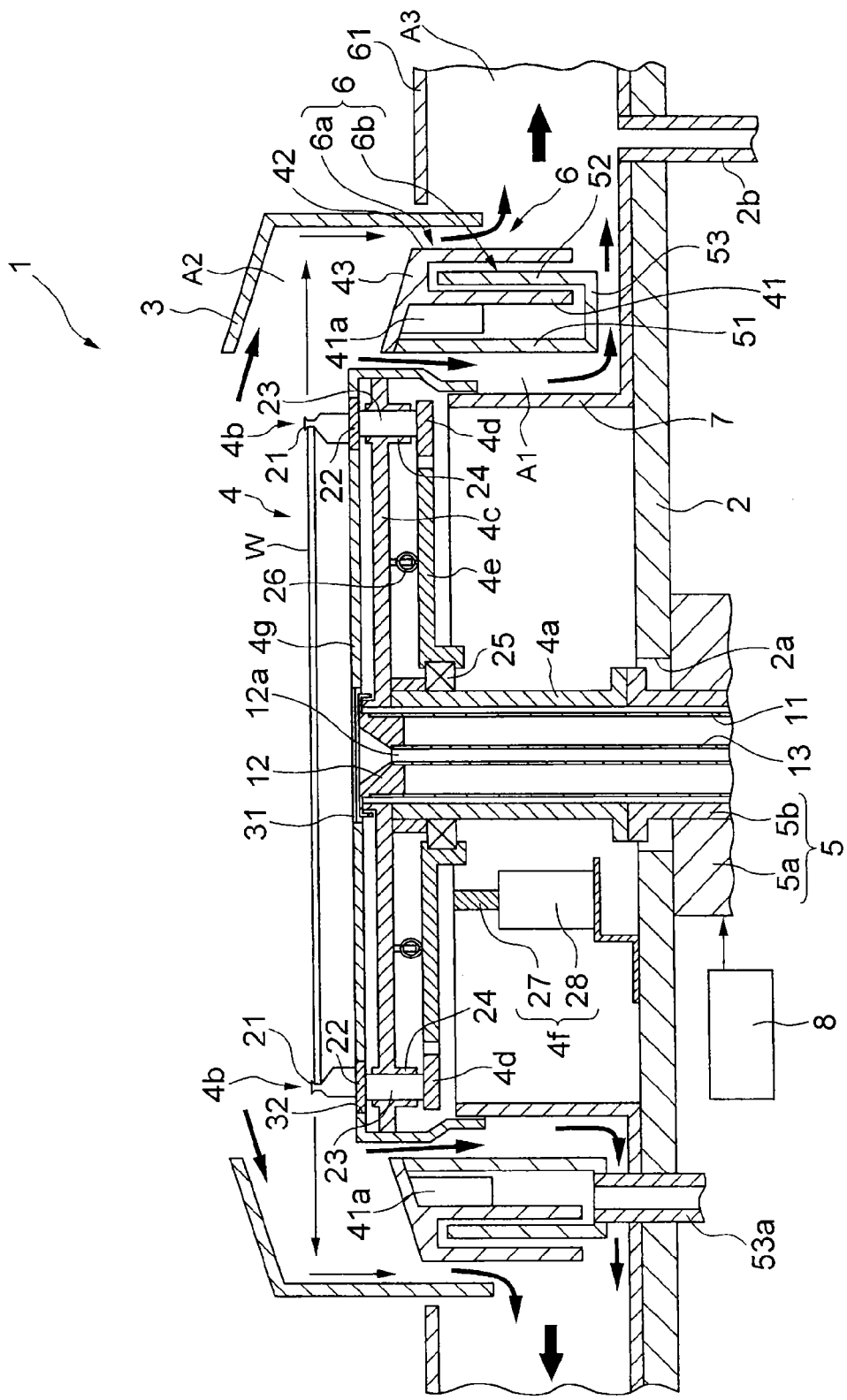
FIG. 2 is a sectional view showing the schematic configuration of the spin treatment apparatus in which a movable liquid receiver according to the embodiment is at a lid-closing position.

As shown in FIGS. 1 and 2, a spin treatment apparatus 1 according to the embodiment includes: a base body 2 serving as the base of the spin treatment apparatus 1; a cup body 3 with an open upper surface; a rotary body 4 configured to rotate inside the cup body 3; a drive motor 5 configured to rotate the rotary body 4; an annular liquid receiver 6 surrounding the rotary body 4 (the liquid receiver 6 has a circular-ring shape in this embodiment, and the same applies to the below); an annular partitioning member 7 surrounding space between the base body 2 and the rotary body 4, and a controller 8 (e.g., a microcomputer) configured to control each part.

The base body 2 has a plate shape, and a through-hole 2a is formed at a center portion of a bottom surface of the base body 2. In addition, drainage tubes 2b configured to drain sump solution are connected to a peripheral edge portion of the base body 2 at predetermined intervals in a peripheral direction of the base body 2.

The cup body 3 has a tubular (annular) shape with an open upper surface and an open lower surface, and accommodates thereinside the rotary body 4, the liquid receiver 6, and the like. An upper end portion of the cup body 3 slants radially inward over the entire periphery. The cup body 3 can be moved up and down by an up-and-down mechanism (not shown) such as a cylinder.

The rotary body 4 includes: a cylindrical power transmission body 4a configured to transmit power from the drive motor 5; multiple (e.g., six) clamp portions 4b configured to clamp a substrate W; a rotary plate 4c configured to retain the clamp portions 4b; multiple pinions 4d attached to the respective clamp portions 4b; a master gear 4e configured to mesh with the pinions 4d; a stop-position determination portion 4f configured to restrict the rotation of the master gear 4e; and a cover 4g configured to cover each part.

The drive motor 5 includes a tubular stator 5a and a tubular rotor 5b rotatably inserted into the stator 5a. The drive motor 5 is a motor serving as a drive source for rotating the substrate W clamped by the clamp portions 4b. The drive motor 5 is electrically connected to the controller 8, and is driven according to the control by the controller 8.

The power transmission body 4a is fixed to the rotor 5b of the drive motor 5 such that the rotation axis (center axis) of the power transmission body 4a coincides with the rotation axis of the drive motor 5. The power transmission body 4a rotates along with the rotor 5b. In other words, the power transmission body 4a is rotated by the drive motor 5.

A stationary shaft 11 which does not rotate is provided in the space inside the power transmission body 4a and the rotor 5b. This stationary shaft 11 is provided with a nozzle head 12 at an upper portion thereof. A nozzle 12a configured to eject a treatment liquid (e.g., a chemical liquid or pure water) toward the back surface of the substrate W clamped by the clamp portions 4b is formed at the nozzle head 12. The nozzle 12a is connected to a supply pipe 13 through which the treatment liquid flows. In addition, although not shown, a nozzle for supplying a treatment liquid (e.g., a chemical liquid or pure water) to the front surface of the substrate W is also provided above the rotary body 4.

The clamp portions 4b are placed at predetermined intervals, e.g. at regular intervals, in a peripheral direction about the rotation axis of the power transmission body 4a. These clamp portions 4b implement a mechanism for clamping the substrate W with the center of the substrate W being aligned with the rotation axis of the power transmission body 4a.

Each clamp portion 4b includes a clamp pin 21 configured to be in contact with the substrate W, a rotary plate 22 configured to retain the clamp pin 21 and rotate, and a pin rotator 23 configured to retain the rotary plate 22 and rotate. The clamp pin 21 is inversely tapered and is integral with the rotary plate 22 by being fixed to an upper surface of the rotary plate 22 with its center being offset from the rotation axis of the pin rotator 23 by a certain distance. The clamp pin 21 eccentrically rotates as the pin rotator 23 rotates. The pin rotator 23 is rotatably retained by a tubular support portion 24 of the rotary plate 4c.

The clamp portion 4b operates as follows. When the pin rotator 23 rotates in a direction for clamping the substrate W, the clamp pin 21 on the rotary plate 22 eccentrically rotates, coming into contact with the outer peripheral surface (end surface) of the substrate W. Likewise, the clamp pins 21 of the other clamp portions 4b come into contact with the outer peripheral surface of the substrate W. Thus, the clamp pins 21 clamp the substrate W while aligning the center of the substrate W with the rotation axis of the power transmission body 4a. On the other hand, when the pin rotator 23 rotates in a releasing direction which is the opposite from the clamping direction, the clamp pin 21 on the rotary plate 22 eccentrically rotates in a direction opposite to the aforementioned direction and moves away from the outer peripheral surface of the substrate W. The clamp pins 21 of the other clamp portions 4b also move away from the outer peripheral surface of the substrate W, releasing the clamped substrate W.

The rotary plate 4c is integral with the power transmission body 4a by being fixed to the outer peripheral surface of the power transmission body 4a. The rotary plate 4c rotates along with the power transmission body 4a while retaining the clamp portions 4b. When the rotary plate 4c rotates along with the power transmission body 4a as the power transmission body 4a rotates, the clamp portions 4b also rotate about the rotation axis of the power transmission body 4a.

Each pinion 4d is fixed to a lower portion of the pin rotator 23 of a corresponding one of the clamp portions 4b, and rotates along with the pin rotator 23. The pinions 4d mesh with the master gear 4e and rotate when the master gear 4e rotates.

The master gear 4e is provided on the outer peripheral surface of the power transmission body 4a and is allowed to rotate by bearings 25. The master gear 4e is biased by a bias member 26, such as a clamp spring, counterclockwise for example. Hence, the pinions 4d rotate clockwise, causing the pin rotators 23 to rotate clockwise (in the clamp direction) in conjunction with the rotation of the pinions 4d. The clamp pins 21 thereby eccentrically rotate and come into contact with the outer peripheral surface of the substrate W. This allows the substrate W to be clamped by the clamp pins 21 and rotate along with the rotary body 4.

The stop-position determination portion 4f includes a stop pin (cylinder pin) 27 configured to restrict the rotation of the master gear 4e and an up-and-down cylinder 28 configured to move the stop pin 27 up and down. The stop pin 27 is moved by the up-and-down cylinder 28 to engage with any of the teeth of the master gear 4e and inhibits the rotation of the master gear 4e. The up-and-down cylinder 28 is electrically connected to the controller 8 and moves up and down according to a control by the controller 8. If the rotary plate 4c is rotated counterclockwise by the drive motor 5 with the rotation of the master gear 4e being restricted by the stop pin 27, the pinions 4d rotate counterclockwise. In conjunction with this rotation, the pin rotators 23 rotate counterclockwise (the releasing direction), releasing the substrate W from the clamp pins 21.

The cover 4g is a case with an open lower surface, and covers the aforementioned parts configured to rotate with the rotation of the power transmission body 4a to prevent occurrence of turbulent flow. This cover 4g has an opening portion 31 configured to allow the treatment liquid ejected from the nozzle 12a of the nozzle head 12 to pass up therethrough, and multiple through-holes 32 in each of which the rotary plate 22 of a corresponding one of the clamp portions 4b is inserted.

The liquid receiver 6 includes an annular movable liquid receiver (first liquid receiver) 6a and an annular stationary liquid receiver (second liquid receiver) 6b. The movable liquid receiver 6a and the stationary liquid receiver 6b are provided to surround the rotary body 4 with its center coinciding with the rotation axis of the rotary body 4.

The movable liquid receiver 6a has an annular inner wall 41, an annular outer wall 42, and an annular upper-surface wall 43 connecting the upper end portions of the inner wall 41 and the outer wall 42 together. The upper end portion of the inner wall 41 slants radially inward over the entire periphery. To match the slant, the outer surface (upper surface) of the upper-surface wall 43 also gradually decreases in height in a direction away from the rotary body 4. The annular inner wall 41 and outer wall 42 have an annular space of a predetermined width in between.

The annular inner wall 41 has multiple slanted plate members 41a on its inner peripheral surface on the rotary body 4 side, along the annular direction of the inner wall (details will be given later). These slanted plate members 41a are provided to receive droplets flying from the end portion of the substrate W, before they come into contact with the inner peripheral surface of the annular inner wall 41.

An up-and-down mechanism (not shown) such as a cylinder allows the movable liquid receiver 6a to move up and down, or specifically, between a liquid receiving position (see FIG. 1) at which the slanted plate members 41a receive liquid from the substrate and a lid-closing position (see FIG. 2) at which the movable liquid receiver 6a prevents ingress of liquid to the stationary liquid receiver 6b. The upper end portion of the movable liquid receiver 6a is higher than the height of the substrate W on the rotary body 4 at the liquid receiving position and is lower than the height of the substrate W on the rotary body at the lid-closing position. Hence, to collect a chemical liquid, the movable liquid receiver 6a moves up to receive the liquid from the substrate W on the rotary body 4 and passes the liquid into the stationary liquid receiver 6b.

The stationary liquid receiver 6b has an annular inner wall 51, an annular outer wall 52, and a bottom-surface wall 53 connecting the lower end portions of the inner wall 51 and the outer wall 52 together. Multiple collection pipes 53a for collecting a chemical liquid are connected to the bottom-surface wall 53 peripherally at predetermined intervals. The annular inner wall 51 and outer wall 52 have an annular space of a predetermined width in between.

The stationary liquid receiver 6b is placed such that the inner wall 41 of the movable liquid receiver 6a is located between the annular inner wall 51 and the annular outer wall 52. The stationary liquid receiver 6b can collect the liquid received by the slanted plate members 41a of the movable liquid receiver 6a. More specifically, the stationary liquid receiver 6b allows the liquid which has hit the slanted plate members 41a of the movable liquid receiver 6a to be collected in a space (an area) between the two annular walls: the inner wall 51 and the outer wall 52.

When the movable liquid receiver 6a down at the lid-closing position, the stationary liquid receiver 6b has a structure in which the movable liquid receiver 6a at the lid-closing position serves as a lid closing the opening of the stationary liquid receiver 6b. When at the lid-closing position to serve as the lid closing the opening of the stationary liquid receiver 6b, the movable liquid receiver 6a prevents ingress of the liquid into the stationary liquid receiver 6b. Since the annular outer wall 52 is covered by the outer wall 42 of the movable liquid receiver 6a to ensure the prevention of liquid ingress to the stationary liquid receiver 6b, mixing of liquids can be prevented.

With the movable liquid receiver 6a up at the liquid receiving position, liquid flying from the end portion of the substrate W hits the slanted plate members 41a of the movable liquid receiver 6a, flows along the slanted plate members 41a, and is collected in the stationary liquid receiver 6b to be thereafter collected through the collection pipes 53a. With the movable liquid receiver 6a down at the lid-closing position, the liquid flying from the end portion of the substrate W flows through a flow channel running from the inner peripheral surface of the cup body 3 to the base body 2, and is then drained through the drainage tubes 2b. In this way, the flow channel for liquid can be switched (between the collection flow channel and the drainage flow channel) according to, for example, the kind of the liquid.

With the movable liquid receiver 6a down at the lid-closing position, the liquid flying from the end portion of the substrate W hits the inner peripheral surface of the cup body 3. However, the distance from the end portion of the substrate W to the inner peripheral surface of the cup body 3 is long to create the space for the liquid receiver 6, and moreover, an exhaust flow exists. For these reasons, the liquid is prevented from returning toward the surface of the substrate W after hitting the inner peripheral surface of the cup body 3.

The annular partitioning member 7 is provided on the base body 2, inside the annular liquid receiver 6. The partitioning member 7 is fixed to the base body 2 to form an annular inner exhaust flow channel A1 for generating an airflow along the inner peripheral surface and the lower surface of the liquid receiver 6 which constitute the outer surface of the liquid receiver 6. An annular space is provided between the partitioning member 7 and the inner wall 51 of the stationary liquid receiver 6b, and communicates with an annular interspace provided between the outer peripheral surface of the cover 4g of the rotary body 4 and the inner wall 51 of the stationary liquid receiver 6b. The inner exhaust flow channel A1 is formed in these spaces.

The annular cup body 3 surrounds the liquid receiver 6 at a distance from the outer periphery thereof to form an annular outer exhaust flow channel A2 for generating an airflow along the upper surface and the outer peripheral surface of the liquid receiver 6 which constitute the outer surface of the liquid receiver 6. An annular interspace is formed between the cup body 3 and the outer wall 42 of the movable liquid receiver 6a, and serves as the outer exhaust flow channel A2.

The thickness (sectional size) of the outer exhaust flow channel A2 changes depending on whether the movable liquid receiver 6a moves up or down. For example, the higher the movable liquid receiver 6a, the thinner the outer exhaust flow channel A2, and the lower the movable liquid receiver 6a, the thicker the outer exhaust flow channel A2. The thickness of the outer exhaust flow channel A2 can thus be controlled. As examples of this control, the outer exhaust flow channel A2 is thinned to increase the internal emission when the substrate W is rotating at high speed (drying treatment), and is thickened when the substrate W is rotating at low speed (chemical liquid treatment).

The inner exhaust flow channel A1 and the outer exhaust flow channel A2 are connected to an exhaust flow channel A3 which is connected to a duct. The exhaust flow channel A3 is an exhaust space defined by the base body 2 and a partitioning plate 61. Hence, the airflow through the inner exhaust flow channel A1 and the airflow through the outer exhaust flow channel A2 are mixed in the exhaust flow channel A3 to become as airflow of the exhaust flow channel A3. Rotation of the substrate W generates a flow of air from the substrate W into the inner exhaust flow channel A1 and a flow of air from the substrate W into the outer exhaust flow channel A2. These airflows can prevent liquid flying from the end portion of the substrate W from returning to the substrate W side.

Next, the movable liquid receiver 6a is described in detail.

Figure 3:
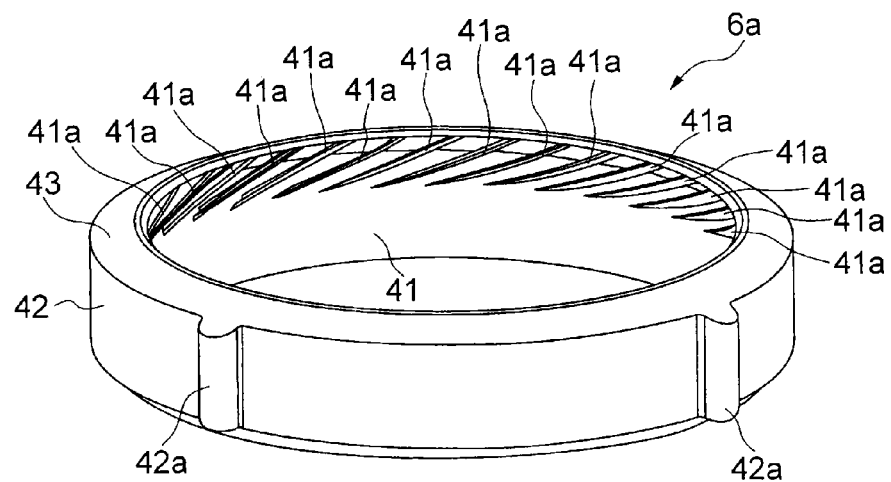
FIG. 3 is a perspective view of the movable liquid receiver according to the embodiment.

As shown in FIG. 3, the movable liquid receiver 6a has the annular inner wall 41, the annular outer wall 42, and the upper-surface wall 43 connecting the upper end portions of the inner wall 41 and the outer wall 42. The upper end portion of the inner wall 41 slants radially inward over the entire periphery.

The multiple slanted plate members 41a are arranged at regular intervals peripherally on an upper side of the inner peripheral surface of the annular inner wall 41, and droplets thrown from the rotating substrate W directly hit these slanted plate members 41a. These slanted plate members 41a, which are plate-shaped flat members (liquid receiving plate members), are formed in the peripheral direction of the annular inner wall 41 (the peripheral direction of the substrate W) and gradually slant at a predetermined slant angle relative to the rotation axis of the substrate W which is perpendicular the substrate W at the center thereof.

In addition, multiple (e.g., three) attachment portions 42a are provided on the outer peripheral surface of the annular outer wall 42 to be each attached to an up-and-down shaft (not shown). The up-and-down shaft is moved up and down by an up-and-down mechanism (not shown) such as a cylinder. Thereby, the movable liquid receiver 6a is moved up and down.

Figure 4:
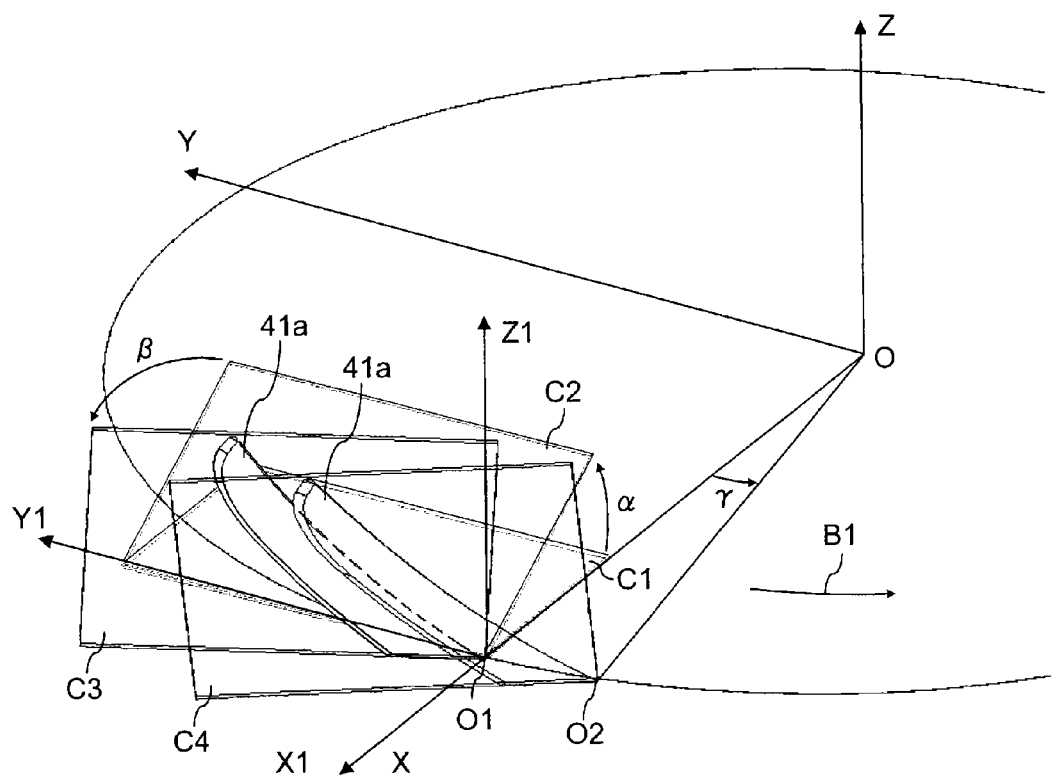
FIG. 4 is an enlarged perspective view showing slanted plate members of the movable liquid receiver according to the embodiment.

As shown in FIG. 4, each slanted plate member 41a is placed so as to be contained by a plane C3 which is slanted at angles α and β relative to a spin axis Z shown in FIG. 4.

In addition, the slanted plate members 41a are arranged on the annular inner wall 41 sequentially at a predetermined pitch angle γ.

Figure 5:
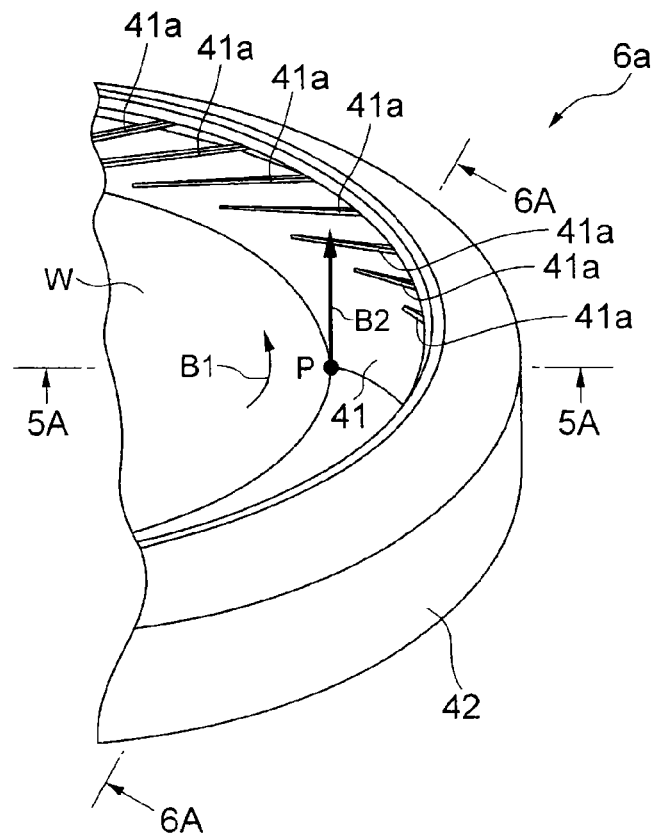
FIG. 5 is an enlarged perspective view showing part of the movable liquid receiver according to the embodiment with a substrate.

As shown in FIG. 5, when the substrate W is rotating in the direction of arrow B1, a droplet thrown from point P at the end of the substrate W after flowing on the substrate W flies in the direction of arrow B2 (the direction of a tangent touching the point P). This flying droplet hits any of the slanted plate members 41a. The slanted plate members 41a are designed to touch the flying droplet at a shallow angle (e.g., 45° or smaller).

Figure 6:
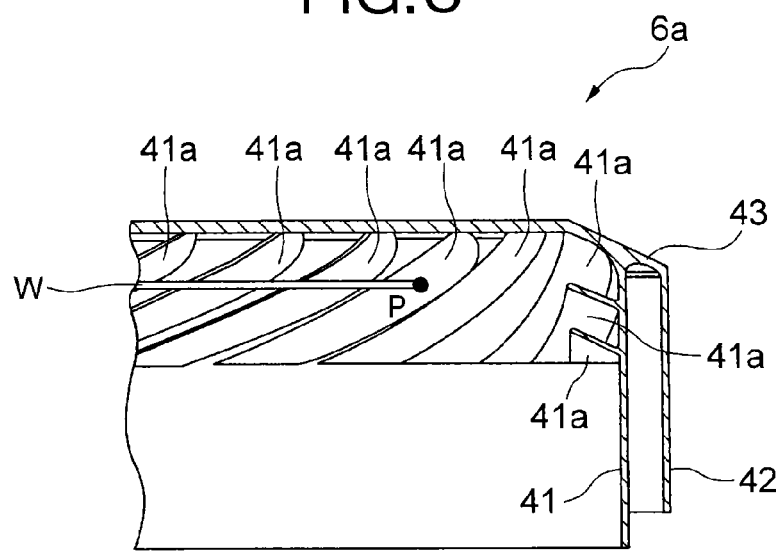
FIG. 6 is a sectional view taken along line 5A-5A in FIG. 5.

Further, in FIG. 6 showing the inner wall 41 from the viewpoint of the point P, the inner peripheral surface of the inner wall 41 is covered by the slanted plate members 41a. For example, each of the slanted plate members 41a is provided in such a manner as to intersect with an imaginary line extending from the point P at the end of the substrate W in the direction of a tangent to the rotation of the substrate W (the direction of the arrow B2 in FIG. 5) before the inner peripheral surface of the inner wall 41 does. Thereby, the slanted plate members 41a can catch a droplet thrown from the point P without fail, preventing the droplet thrown from the point P from hitting the inner peripheral surface of the inner wall 41.

Figure 7:
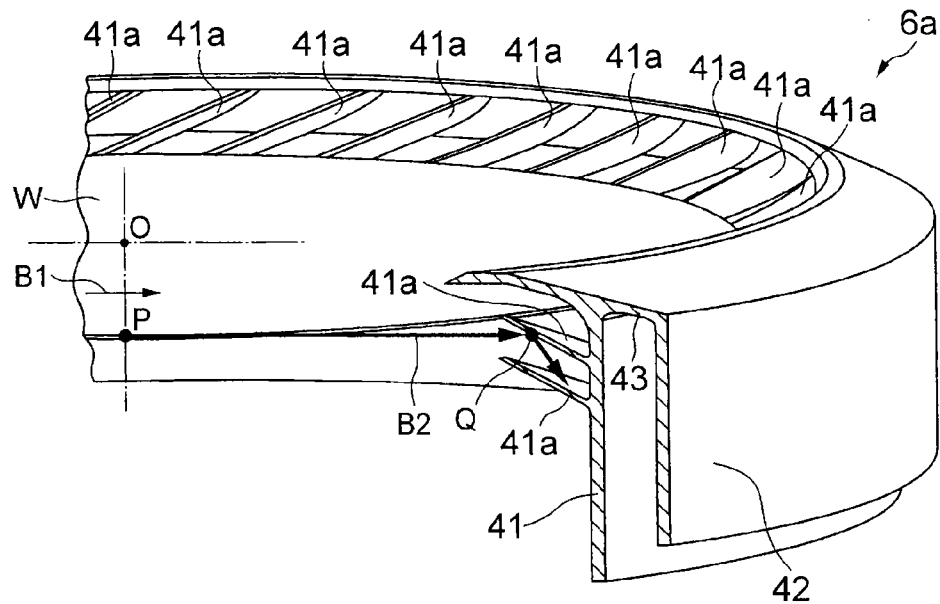
FIG. 7 is a sectional view taken along line 6A-6A in FIG. 5.

Moreover, as shown in FIG. 7, a droplet thrown from the point P at the end of the substrate W flies in the direction of the arrow B2 and hits a point Q on the lower surface of one of the slanted plate members 41a (the slanted surface slanting downward). Then, the droplet either moves along that lower surface or partially splashes back from the lower surface and moves to the upper surface (the slanted surface slanting downward) of the slanted plate member 41a below. Even if the droplet splits on the lower surface such that part of the droplet splashes back, the splash-back part of the droplet flies with a rotational-direction component. Thus, the droplet is unlikely to splash back in a way to return to the substrate W side. For this reason, the slanted plate members 41a can prevent liquid from splashing back to the substrate W side.

Figure 8:
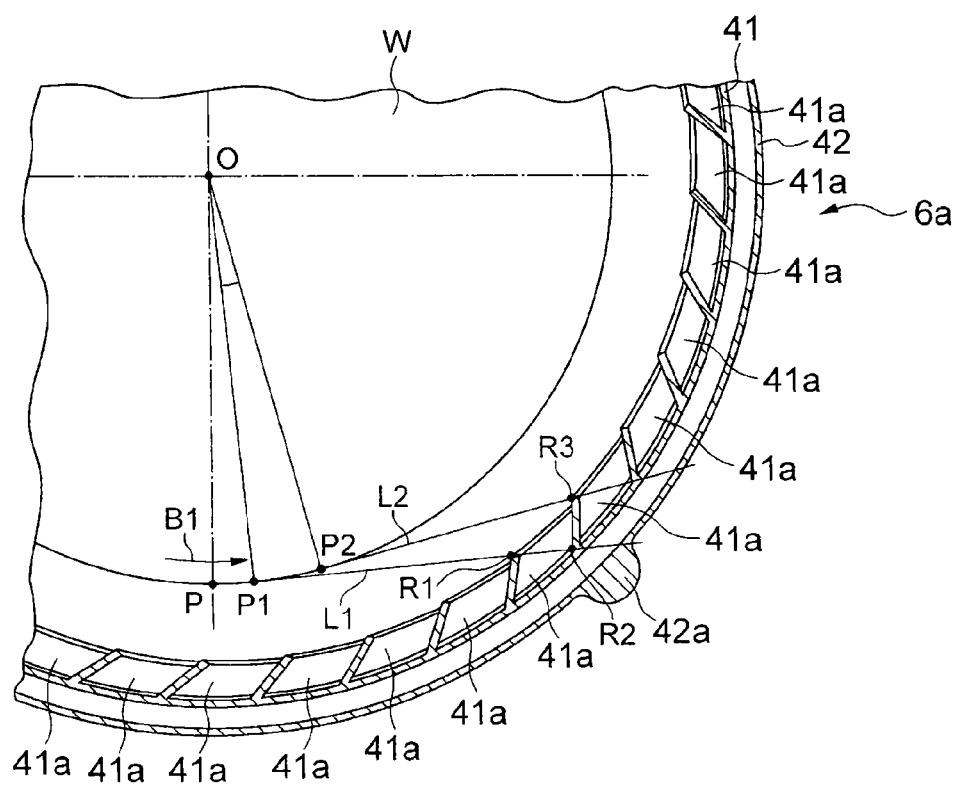
FIG. 8 is a sectional view of the movable liquid receiver, sectioned along the surface of the substrate in FIG. 5.

Moreover, as shown in FIG. 8, the slanted plate members 41a are arranged with such a pitch (intervals) that a tangent (imaginary line) to the point P1 at the end of the substrate W passes through end point R1 of a certain slanted plate member 41a and also passes through point R2 on the slanted surface of the next slanted plate member 41a (the slanted plate member 41a adjacent to the certain slanted plate member 41a in the rotational direction of the substrate W). When the slanted plate members 41a are arranged with such a pitch, a tangent (imaginary line) L2 passing through an end point R3 on the slanted plate member 41a having the point R2 passes through a point P2 at the end of the substrate W. Hence, the angle between the point P1 and the point P2 is the arrangement angle for the slanted plate members 41a.

For the reason above, droplets thrown from somewhere between the point P1 and the point P2 by the rotation of the substrate W hit somewhere between the point R2 and the point R3. Thus, the slanted plate member 41a receives all the droplets from between the point P1 and the point P2. Thereby, no droplet flying from the end portion of the substrate W directly hits the inner peripheral surface of the inner wall 41 of the movable liquid receiver 6a. Thus, splash-back of liquid to the substrate W can be reduced considerably. The aforementioned arrangement of the slanted plate members 41a on the inner peripheral surface of the inner wall 41 of the movable liquid receiver 6a enables a structure causing liquid not to splash back toward the substrate W. Thus, the distance between the movable liquid receiver 6a and the end portion of the substrate W can be reduced to decrease the size of the outer shape of the movable liquid receiver 6a. This contributes to size and weight reduction of the apparatus.

To ensure prevention of liquid splash-back, the interval between the adjacent slanted plate members 41a needs to be short, which means an increase in the number of the slanted plate members 41a. To be arranged at regular intervals at a predetermined angle, the slanted plate members 41a need a structure allowing them to be fixed to the inner wall 41 of the movable liquid receiver 6a at a controlled angle. Such a structure requires the slanted plate members 41a to be thick, increasing the weight of the movable liquid receiver 6a. Particularly when being designed to switch a flow channel through which liquid from the upper surface of the substrate W flows, the spin treatment apparatus needs a mechanism for moving the liquid receiver (movable liquid receiver) up and down, and therefore the liquid receiver is desirably light in weight.

Various means such as machining and resin welding can be used to fabricate the movable liquid receiver 6a. The liquid receiver 6, which is to be in contact with a chemical liquid, needs to be made of a member with a high chemical resistance. A fluororesin is desirably used as the member resistant to a chemical used for treatment during manufacturing of semiconductors or liquid crystals. However, it is difficult to fabricate the movable liquid receiver 6a with a fluororesin by machining or the like. More specifically, it is difficult to form thin, complicated shapes by machining or the like using a fluororesin.

To enable the aforementioned fixation and angle control of the plate members and to make the movable liquid receiver 6a lightweight, three-dimensional (3D) additive manufacturing (a 3D printer) is desirably used. A 3D printer can form complicated 3D shapes, and therefore can form the slanted plate members 41a which are thin and slanted at an accurate angle.

To be more specific, the movable liquid receiver 6a is fabricated by forming a resin member (a basic body of the movable liquid receiver 6a) by 3D additive manufacturing, and then coating the formed resin member with a fluororesin (e.g., polytetrafluoroethylene). The coating with a fluororesin can drastically improve the resistance of the movable liquid receiver 6a against a chemical liquid. The 3D additive manufacturing forms a resin member by stacking successive layers of resin. Hence, the completed resin member has net-shaped gaps, like an interconnected-cell structure having minute interconnected cells. For this reason, when the resin member is coated with a fluororesin, the net-shaped gaps in the resin member are filled with the fluororesin. Thus, the coated resin member not only is covered by the fluororesin, but also incorporates net-shaped fluororesin bodies.

Next, spin treatment operation of the spin treatment apparatus 1 is described.

In the spin treatment operation, with the substrate W being clamped by the clamp pins 21 and rotated by the rotary body 4 which is rotated by the drive motor 5, a treatment liquid (e.g., a chemical liquid or pure water) is supplied to the upper (front) surface and the lower (back) surface of the rotating substrate W. The supply of the treatment liquid is stopped after a predetermined period of time, and the rotary body 4 is rotated faster than the speed employed in the liquid supply. During the supply and shaking off of the treatment liquid, the centrifugal force and airflows generated by the rotation cause the treatment liquid supplied to the upper and lower surfaces of the substrate W to flow outward in terms of the radial direction of the substrate W and fly from the outer peripheral edge of the substrate W. In such a treatment, (up-and-down) movement of the movable liquid receiver 6a allows a switch between the collection flow channel for collecting the treatment liquid and the drainage flow channel for draining the treatment liquid.

When the liquid flow channel is the collection flow channel, i.e., when the movable liquid receiver 6a is up at the liquid receiving position to collect the treatment liquid (see FIG. 1), the liquid flying from the end portion of the substrate W hits the slanted plate members 41a of the movable liquid receiver 6a, flows along the slanted plate members 41a to be collected in the stationary liquid receiver 6b, and is then collected through the collection pipes 53a.

In this event, a flow of air from the substrate W side to the inner exhaust flow channel A1 and a flow of air from the substrate W side to the outer exhaust flow channel A2 are generated. These airflows can prevent the liquid flying from the end portion of the substrate W from returning to the substrate W side. To be more specific, there is an annular exhaust flow channel on both sides of the liquid receiver 6, namely the inner exhaust flow channel A1 on the rotary body 4 side of the liquid receiver and the outer exhaust flow channel A2 on the opposite side of the liquid receiver 6. Thus, air pushed by the rotation of the substrate W flows through the inner exhaust flow channel A1 and the outer exhaust flow channel A2. For this reason, even if mist of liquid is generated in the liquid receiver 6, the mist is prevented from returning to the substrate W side.

Further, provided on the inner peripheral surface of the annular inner wall 41, the slanted plate members 41a receive droplets flying from the end portion of the substrate W, before they hit the inner peripheral surface of the annular inner wall 41. The droplets flying from the end portion of the substrate W therefore do not directly hit the inner peripheral surface of the inner wall 41 of the movable liquid receiver 6a. Hence, liquid splash-back, which is to hit the inner peripheral surface and then return to the substrate W side, can be drastically reduced.

On the other hand, when the liquid flow channel is the drainage flow channel, i.e., when the movable liquid receiver 6a is down at the lid-closing position to drain the treatment liquid (see FIG. 2), the liquid flying from the end portion of the substrate W hits the inner peripheral surface of the cup body 3, flows through the flow channel extending from the cup body 3 to the base body 2, and is then drained through the drainage tubes 2b.

In this event, the liquid flying from the end portion of the substrate W hits the inner peripheral surface of the cup body 3, but is prevented from returning to the surface of the substrate W because the distance from the end portion of the substrate W to the inner peripheral surface of the cup body 3 is sufficiently long, and moreover, there are the exhaust airflows.

As described above, according to the embodiment, since the inner exhaust flow channel A1 and the outer exhaust flow channel A2 are provided, air pushed by the rotation of the substrate W flows through the inner exhaust flow channel A1 and the outer exhaust flow channel A2. This can prevent the liquid flying from the end portion of the substrate W from returning to the substrate W side. Thereby, the distance between the end portion of the substrate W and the liquid receiver 6 can be shortened to reduce the size of the outer shape of the liquid receiver 6. Thus, a spin treatment apparatus small in size and light in weight can be obtained while achieving suppression of liquid splash-back to the substrate W side.

Further, the slanted plate members 41a are provided on the inner peripheral surface of the annular inner wall 41 of the movable liquid receiver 6a of the liquid receiver 6 and can receive droplets flying from the end portion of the substrate W before the droplets hit the inner peripheral surface of the inner wall 41. Thus, the flying droplets do not directly hit the inner peripheral surface of the inner wall 41 of the movable liquid receiver 6a, and therefore liquid splash-back to the substrate W side can be drastically reduced. Consequently, the distance between the end portion of the substrate W and the liquid receiver 6 can be shortened to reduce the size of the outer shape of the liquid receiver 6. Thus, a spin treatment apparatus small in size and light in weight can be obtained while achieving suppression of liquid splash-back to the substrate W side.

Although a disc-shaped substrate such as a circular wafer is used as the substrate W to be treated in the above embodiment, the shape of the substrate W is not limited. For example, the substrate W to be treated may be a glass substrate having a rectangular shape, such as a liquid crystal panel.

In addition, although one type of liquid is collected by the single movable liquid receiver 6a in the above embodiment, the number of types of liquid to be collected is not particularly limited. For example, the number of the types of liquid to be separated (collected) can be increased to two by providing an annular partitioning plate in the middle of the stationary liquid receiver 6b and providing two movable liquid receivers 6a side by side (doubly one on top of the other).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A spin treatment apparatus that performs treatment on a substrate while rotating the substrate, the apparatus comprising:
   an annular liquid receiver surrounding the rotating substrate at a distance from an outer periphery of the substrate and configured to receive liquid flying from the rotating substrate and accommodate the liquid, wherein:
the annular liquid receiver includes a plurality of slanted plate members each provided on an inner peripheral surface of the annular liquid receiver in such a manner that each of the plurality of slanted plate members gradually becomes lower along a rotation direction of the substrate and configured to receive liquid flying from the rotating substrate,
the plurality of slanted plate members are arranged in a peripheral direction of the inner peripheral surface of the annular liquid receiver to prevent the liquid flying from any position of the outer periphery of the substrate and traveling in a straight line from hitting the inner peripheral surface of the annular liquid receiver,
an upper end portion of the annular liquid receiver is formed to slant inward over an entire periphery of the annular liquid receiver, and
the plurality of slanted plate members are formed to extend to an inner peripheral surface of the upper end portion.

2. The spin treatment apparatus according to claim 1, wherein a distance between an adjacent pair of the plurality of slanted plate members is determined to prevent the liquid flying from any position of the outer periphery of the substrate and traveling in a straight line from hitting the inner peripheral surface of the annular liquid receiver.

3. The spin treatment apparatus according to claim 1, further comprising an annular partitioning member provided inside the annular liquid receiver and forming an annular inner exhaust flow channel to generate an airflow along the inner peripheral surface of the annular liquid receiver.

4. The spin treatment apparatus according to claim 2, further comprising an annular partitioning member provided inside the annular liquid receiver and forming an annular inner exhaust flow channel to generate an airflow along the inner peripheral surface of the annular liquid receiver.

5. The spin treatment apparatus according to claim 1, wherein the plurality of slanted plate members are formed so that the liquid flying from any position of the outer periphery of the rotating substrate and traveling in a straight line hits on a lower surface of at least any one of the plurality of slanted plate members.

6. The spin treatment apparatus according to claim 2, wherein the plurality of slanted plate members are formed so that the liquid flying from any position of the outer periphery of the rotating substrate and traveling in a straight line hits on a lower surface of at least any one of the plurality of slanted plate members.

7. The spin treatment apparatus according to claim 1, further comprising an annular cup body surrounding the annular liquid receiver at a distance from an outer periphery of the annular liquid receiver and forming an annular outer exhaust flow channel to generate an airflow along from an upper surface to an outer peripheral surface of the annular liquid receiver, wherein:
the annular liquid receiver includes:
an annular movable liquid receiver movable up and down and including the plurality of slanted plate members on an inner peripheral surface thereof, and
an annular stationary liquid receiver configured to accommodate the liquid received by the plurality of slanted plate members,
when the annular movable liquid receiver is up at a liquid receiving position, the liquid flying from the rotating substrate hits the plurality of slanted plate members, and is accommodated in the annular stationary liquid receiver, and
when the annular movable liquid receiver is down at a lid-closing position, the liquid flying from the rotating substrate hits an inner peripheral surface of the annular cup body, and flows through the annular outer exhaust flow channel.

8. The spin treatment apparatus according to claim 2 further comprising an annular cup body surrounding the annular liquid receiver at a distance from an outer periphery of the annular liquid receiver and forming an annular outer exhaust flow channel to generate an airflow along from an upper surface to an outer peripheral surface of the annular liquid receiver, wherein:
the annular liquid receiver includes:
an annular movable liquid receiver movable up and down and including the plurality of slanted plate members on an inner peripheral surface thereof, and
an annular stationary liquid receiver configured to accommodate the liquid received by the plurality of slanted plate members,
when the annular movable liquid receiver is up at a liquid receiving position, the liquid flying from the rotating substrate hits the plurality of slanted plate members, and is accommodated in the annular stationary liquid receiver, and
when the annular movable liquid receiver is down at a lid-closing position, the liquid flying from the rotating substrate hits an inner peripheral surface of the annular cup body, and flows through the annular outer exhaust flow channel.

9. The spin treatment apparatus according to claim 7, further comprising an annular partitioning member provided inside the annular liquid receiver and forming an annular inner exhaust flow channel to generate an airflow along the inner peripheral surface of the annular liquid receiver.

10. The spin treatment apparatus according to claim 8, further comprising an annular partitioning member provided inside the annular liquid receiver and forming an annular inner exhaust flow channel to generate an airflow along the inner peripheral surface of the annular liquid receiver.

* * * * *